US008271855B2

(12) United States Patent
Norman

(10) Patent No.: US 8,271,855 B2

(45) Date of Patent: Sep. 18, 2012

(54) MEMORY SCRUBBING IN THIRD DIMENSION MEMORY

(75) Inventor: Robert Norman, Pendleton, OR (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 454 days.

(21) Appl. No.: 12/653,896

(22) Filed: Dec. 18, 2009

(65) Prior Publication Data

US 2010/0162067 A1 Jun. 24, 2010

Related U.S. Application Data

(60) Provisional application No. 61/203,456, filed on Dec. 22, 2008.

(51) Int. Cl.
*G11C 29/00* (2006.01)

(52) U.S. Cl. ........................................ 714/764; 714/763

(58) Field of Classification Search .................. 714/763, 714/764, 774
See application file for complete search history.

(56) References Cited

U.S. PATENT DOCUMENTS

| | | | | |
|---|---|---|---|---|
| 7,719,913 | B2 * | 5/2010 | Lung et al. | 365/208 |
| 8,156,403 | B2 * | 4/2012 | Shalvi et al. | 714/764 |
| 2007/0247892 | A1 * | 10/2007 | Egerer | 365/148 |
| 2008/0094886 | A1 * | 4/2008 | Ranjan et al. | 365/171 |
| 2009/0175108 | A1 * | 7/2009 | Dittrich | 365/210.1 |
| 2010/0008133 | A1 * | 1/2010 | Cho et al. | 365/163 |
| 2011/0099460 | A1 * | 4/2011 | Dusija et al. | 714/773 |
| 2011/0307646 | A1 * | 12/2011 | Lee et al. | 711/103 |

* cited by examiner

*Primary Examiner* — Scott Baderman
*Assistant Examiner* — Neil Miles
(74) *Attorney, Agent, or Firm* — Stolowitz Ford Cowger LLP

(57) ABSTRACT

A method for memory scrubbing is provided. In this method, a first resistance of a reference memory element is read. A second resistance of a memory element also is read. A difference between the first resistance and the second resistance is sensed and a programming error associated with the second resistance is detected based on the difference. Each memory element is non-volatile and re-writeable, and can be positioned in a two-terminal memory cell that is one of a plurality of memory cells positioned in a two-terminal cross-point memory array. Active circuitry for performing the memory scrubbing can be fabricated FEOL in a logic layer and one or more layers of the two-terminal cross-point memory arrays can be fabricated BEOL over the logic layer. Each memory cell can optionally include non-ohmic device (NOD) electrically in series with the memory element and the two terminals of the memory cell.

14 Claims, 11 Drawing Sheets

MEMORY SCRUBBING IN THIRD DIMENSION MEMORY

FIELD OF THE INVENTION

The present invention relates to semiconductors and, more particularly, to memory scrubbing in third dimension memory.

BACKGROUND

Generally, memory scrubbing is a process where a memory controller periodically checks and corrects for errors in memory. Memory scrubbing operations are performed periodically to prevent, for example, single bit errors from adding-up into non-correctable multiple bits errors. As a result, memory scrubbing improves the overall reliability of the memory. The memory controller typically initiates memory scrubbing operations during idle periods. The memory scrubbing operation can be repeated for every memory cell within the memory such that the entire memory is periodically checked and cleansed.

In a memory scrubbing operation, the memory controller may read data from a memory cell during idle periods. The memory cell may be selected systematically or at random. If an error is detected, the memory controller corrects the data and writes the corrected data back to the memory.

There are continuing efforts to improve error checking and correction in memory.

BRIEF DESCRIPTION OF THE DRAWINGS

The present invention will be readily understood by the following detailed description in conjunction with the accompanying drawings, and like reference numerals designate like structural elements.

Figure 1:
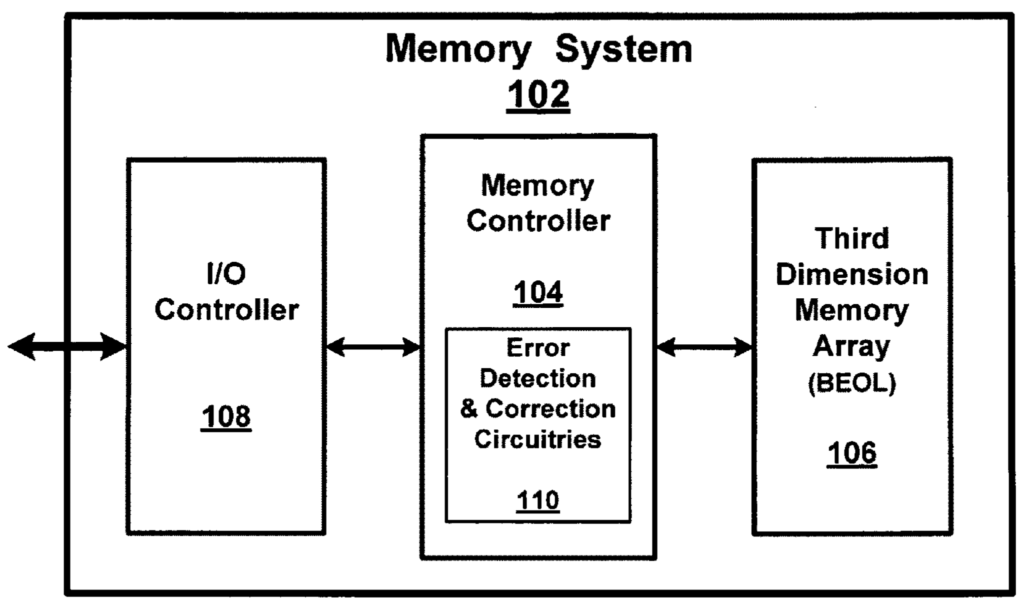
FIG. 1 depicts a simplified block diagram of a memory system, in accordance with an embodiment.

Although the previous drawings depict various examples of the invention, the invention is not limited by the depicted examples. It is to be understood that, in the drawings, like reference numerals designate like structural elements. Also, it is understood that the depictions in the FIGS. are not necessarily to scale.

DETAILED DESCRIPTION

A detailed description of one or more embodiments is provided below along with accompanying figures. The detailed description is provided in connection with such embodiments, but is not limited to any particular embodiment. The scope is limited only by the claims and numerous alternatives, modifications, and equivalents are encompassed. Numerous specific details are set forth in the following description in order to provide a thorough understanding. These details are provided for the purpose of example and the described embodiments may be implemented according to the claims without some or all of these specific details. For the purpose of clarity, technical material that is known in the technical fields related to the embodiments has not been described in detail to avoid unnecessarily obscuring the description.

The embodiments described herein provide methods, systems, and circuitries for memory scrubbing in third dimension memories. In an embodiment, the resistances of a memory element and a reference memory element are read in a memory scrubbing operation. Thereafter, as explained in more detail below, the memory resistance of the memory element is compared with the resistance of the reference memory element. In an example, a difference between the resistances of the reference memory element and the memory element is sensed. A programming error may be detected based the sensed difference.

U.S. patent application Ser. No. 11/095,026, published as U.S. Publication No. 2006-0171200, filed Mar. 30, 2005, and entitled "Memory Using Mixed Valence Conductive Oxides," is herein incorporated by reference in its entirety for all purposes and describes non-volatile third dimensional memory elements that may be arranged in a two-terminal, cross-point memory array. New memory structures are possible with the capability of this third dimensional memory array. In at least some embodiments, a two-terminal memory element or memory cell can be configured to change conductivity when exposed to an appropriate voltage drop across the two-terminals. The memory element can include an electrolytic tunnel barrier and a mixed valence conductive oxide. A voltage drop across the electrolytic tunnel barrier can cause an electrical field within the mixed valence conductive oxide that is strong enough to move oxygen ions out of the mixed valence conductive oxide and into the electrolytic tunnel barrier. When certain mixed valence conductive oxides (e.g., praseodymium-calcium-manganese-oxygen perovskites and lanthanum-nickel-oxygen perovskites) change valence, their conductivity changes. Additionally, oxygen accumulation in certain electrolytic tunnel barriers (e.g., yttrium stabilized zirconia) can also change conductivity. If a portion of the mixed valence conductive oxide near the electrolytic tunnel barrier becomes less conductive, the tunnel barrier width effectively increases. If the electrolytic tunnel barrier becomes less conductive, the tunnel barrier height effectively increases. Both mechanisms can be reversible if the excess oxygen from the electrolytic tunnel barrier flows back into the mixed valence conductive oxide. A memory can be designed to exploit tunnel barrier height modification, tunnel barrier width modification, or both. The technology allows for the emulation of other memory technologies by duplicating the interface signals and protocols, while accessing the third dimensional memory array. The third dimensional memory array may emulate other types of memory, providing memory combinations within a single component. To illustrate the functionality of a third dimensional memory element, consider that the third dimensional memory element switches to a low resistive state in response to a first write voltage, and switches to a high resistive state when a second write voltage is applied. In some examples, the first write voltage may be opposite in polarity from the second write voltage. The resistance of the memory element may be adjusted by the voltage differential across the memory element. As such, the two terminals of the memory element may be coupled to one or more variable voltage sources to create a voltage differential across the two terminals. For example, a first terminal of the memory element may be programmed to be a certain voltage between, for instance, +3 Volts and −3 Volts. Further, a second terminal of the memory element may be programmed to be another voltage between, for instance, +3 Volts and −3 Volts.

In some embodiments, an electrolytic tunnel barrier and one or more mixed valence conductive oxide structures do not need to operate in a silicon substrate, and, therefore, can be fabricated (e.g., back-end-of-the-line BEOL) above circuitry being used for other purposes (e.g., fabricated front-end-of-the-line FEOL). For example, see logic 252 in FIG. 2, where the circuitry can be CMOS devices fabricated FEOL on a silicon wafer and electrically coupled with the memory planes fabricated BEOL above the logic 252. Further, a two-terminal memory cell can be arranged as a cross point such that one terminal is electrically coupled with an X-direction line (or an "X-line") and the other terminal is electrically coupled with a Y-direction line (or a "Y-line"). A third dimensional memory can include multiple memory cells vertically stacked upon one another, sometimes sharing X-direction and Y-direction lines in a layer of memory, and sometimes having isolated lines. When a first write voltage, VW1, is applied across the memory cell (e.g., by applying ½ VW1 to the X-direction line and ½−VW1 to the Y-direction line), the memory cell can switch to a low resistive state. When a second write voltage, VW2, is applied across the memory cell (e.g., by applying ½ VW2 to the X-direction line and ½−VW2 to the Y-direction line), the memory cell can switch to a high resistive state. Memory cells using electrolytic tunnel barriers and mixed valence conductive oxides can have VW1 opposite in polarity from VW2.

FIG. 1 depicts a simplified block diagram of a memory system, in accordance with an embodiment. As shown in FIG. 1, memory system 102 may include input/output (I/O) controller 108, memory controller 104, and third dimension memory array 106. Third dimension memory array 106 can be fabricated BEOL; whereas, circuitry for input/output (I/O) controller 108 and/or memory controller 104 can be fabricated FEOL. Memory controller 104 is connected to or in communication with I/O controller 108 and third dimension memory array 106. In general, I/O controller 108 may be configured to control the transfer of data, memory addresses, and instructions. For example, the transfer may be bi-directional where data are outputted from I/O controller 108 during read operations and, at other times, the data are inputted into the I/O controller. Third dimension memory array 106, as explained in more detail below, is configured to store data based on the resistive state of the memory elements. Memory controller 104 includes logic to control and to manage the flow of data to and from third dimension memory array 106. For example, memory controller 104 may include logic to read and write data to third dimension memory array 106. Memory controller 104 can additionally include error detection and correction circuitries 108. As explained in more detail below, error detection and correction circuitries 108 include logic and/or circuitry to detect and correct programming errors, and that logic and/or circuitry can be fabricated FEOL.

Figure 2:
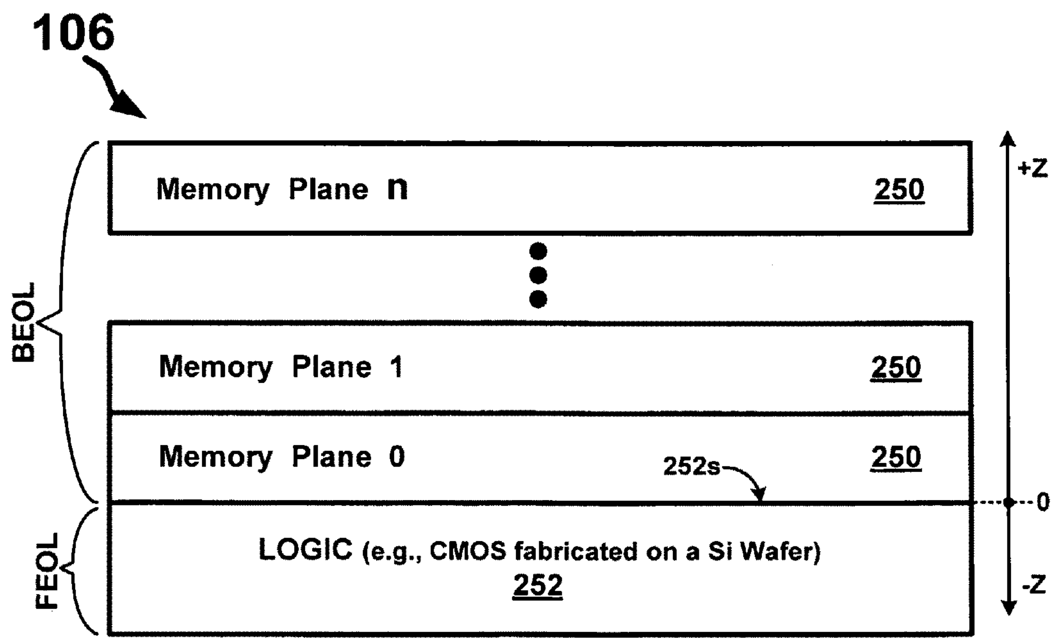
FIG. 2 depicts a simplified block diagram of a third dimension memory array, in accordance with an embodiment.

FIG. 2 depicts a simplified block diagram of a third dimension memory array, in accordance with an embodiment. Third dimension memory array 106, which is connected to logic 252 and may be disposed above the logic, can include a memory array that is vertically configured along multiple memory planes 250 that are fabricated BEOL on top of logic 252. It should be appreciated that logic 252 may include a variety of logic and/or circuitry that is associated with a memory system. For example, logic 252 can include a memory controller and I/O controller, such as the I/O controller 108 and/or memory controller 104, for example. Memory planes 250 can be implemented to emulate various types of memory technologies that permit different physical and logical arrangements (e.g., vertically stacked—see FIGS. 8B and 10). A memory is "third dimension memory" when the memory is fabricated above other circuitry components, the components usually including a silicon substrate, polysilicon layers and, typically, metallization layers. By using non-volatile third dimension memory arrays, such as third dimension memory array 106, memory systems may be vertically-configured to reduce die size and not sacrifice overall chip functionality. Third dimension memory array 106 can be a two-terminal cross-point array where, as shown in the embodiment of FIG. 2, back-end-of-the-line (BEOL) memory arrays in the form of BEOL memory planes 250 can be vertically stacked (e.g., along the +Z axis) on top of front-end-of-the-line (FEOL) logic 252. Here, the logic 252 includes front-end-of-the-line (FEOL) active circuitry for performing data operations on the BEOL memory planes 250. The logic 252 can also include FEOL active circuitry for the he I/O controller 108 and/or memory controller 104 depicted in FIG. 1. The memory planes 250 (e.g., planes 0 thorough n) can be fabricated BEOL on top of the logic 252 which can be fabricated FEOL. That is, the BEOL memory planes 250 are fabricated directly on top of and in contact with an upper surface 252*s* of logic 252.

Figure 3:
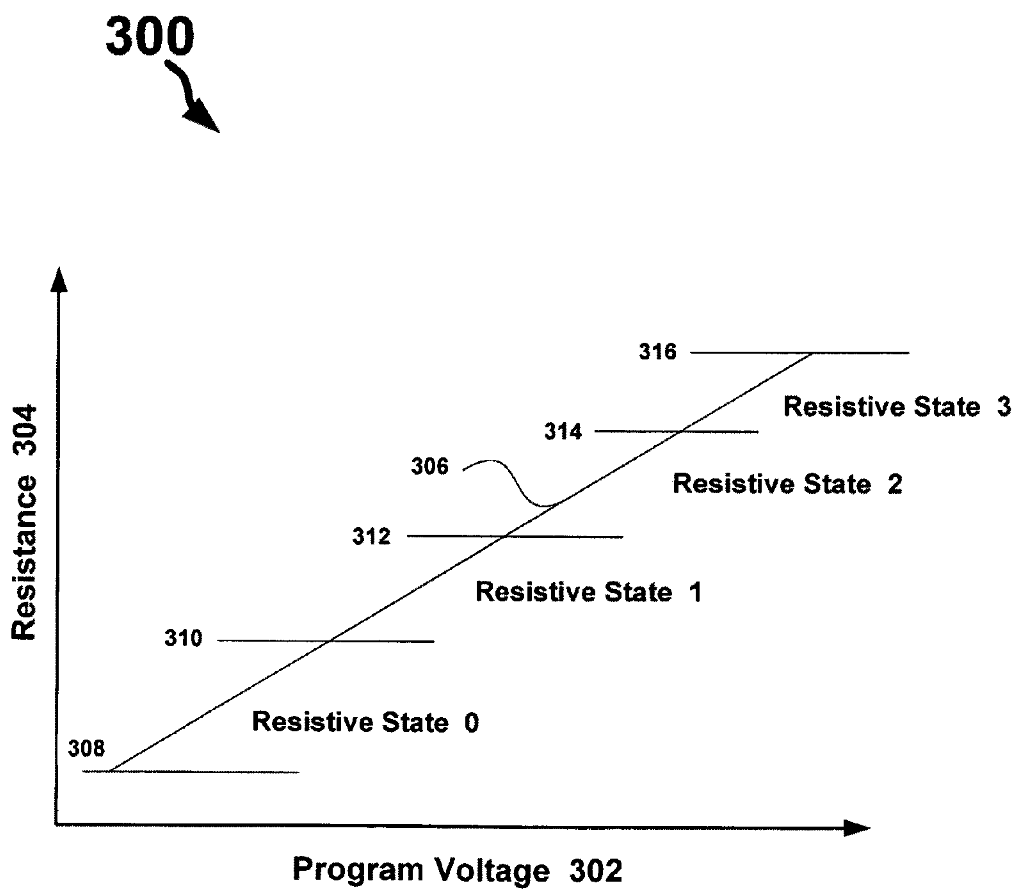
FIG. 3 depicts a graph of the various resistive states that may be associated with a memory element, in accordance with an embodiment.

FIG. 3 depicts a graph 300 of the various resistive states that may be associated with a memory element, in accordance with an embodiment. As discussed above, a change of the resistive state of a memory element is used to determine a data value stored in the memory element. For example, with binary values, a resistive state of a memory element can change from a high resistive state to a low resistive state, or vice versa, that corresponds to the two resistive state of the memory element (e.g., the binary values "1" and "0" of the stored bit value). For example, a binary value of "1" can be indicative of a low resistance erased state and a binary value of "0" can be indicative of a high resistance programmed state. With a multiple resistive state memory array, each of the memory elements may be divided into multiple voltage ranges. FIG. 3 is a graph of a memory element divided into four resistive states 0-3. The graph is defined by horizontal axis 302 and vertical axis 304. The program voltages associated with the memory element define the coordinates along horizontal axis 302. The resistances associated with the memory element define the coordinates along vertical axis 304. The memory element of FIG. 3 is divided into four resistive states 0-3, but it should be appreciated that a memory element can be divided into a number of resistive states. For example, the memory element may be additionally divided into three, eight, sixteen, or other number of divisions.

The plot of the resistances and the program voltages is depicted by a linear line 306. It should be noted that the resistances may not be linear with program voltages. Depending on material physical parameters, such as doping levels and geometries, the resistive states may be non-uniform (i.e., non-linear) and may be irregular in shape. For example, the memory element that stores the resistive state can have a non-linear I-V characteristic. Here, line 306 is divided into four resistive states, namely resistive state 0, resistive state 1, resistive state 2, and resistive state 3. In general, resistive state 0 is located in a region between levels 308 and 310. Resistive state 1 is located in a region between levels 310 and 312. Resistive state 2 is located in a region between levels 312 and 314. Resistive state 3 is located in a region between levels 314 and 316. Accordingly, for example, a program voltage and a resistance that lay between levels 308 and 310 can be associated with resistive state 0. In another example, a program voltage and a resistance that lay between levels 312 and 314 can be associated with resistive state 2. As explained in more detail below, the four resistive states 0-3 may be represented by binary values such as 00, 01, 10, and 11. Therefore, a memory element can store a single bit of data as binary values "0" and "1", or multiple bits of data, such as two-bits of data for binary values such as 00, 01, 10, and 11.

Figure 4A:
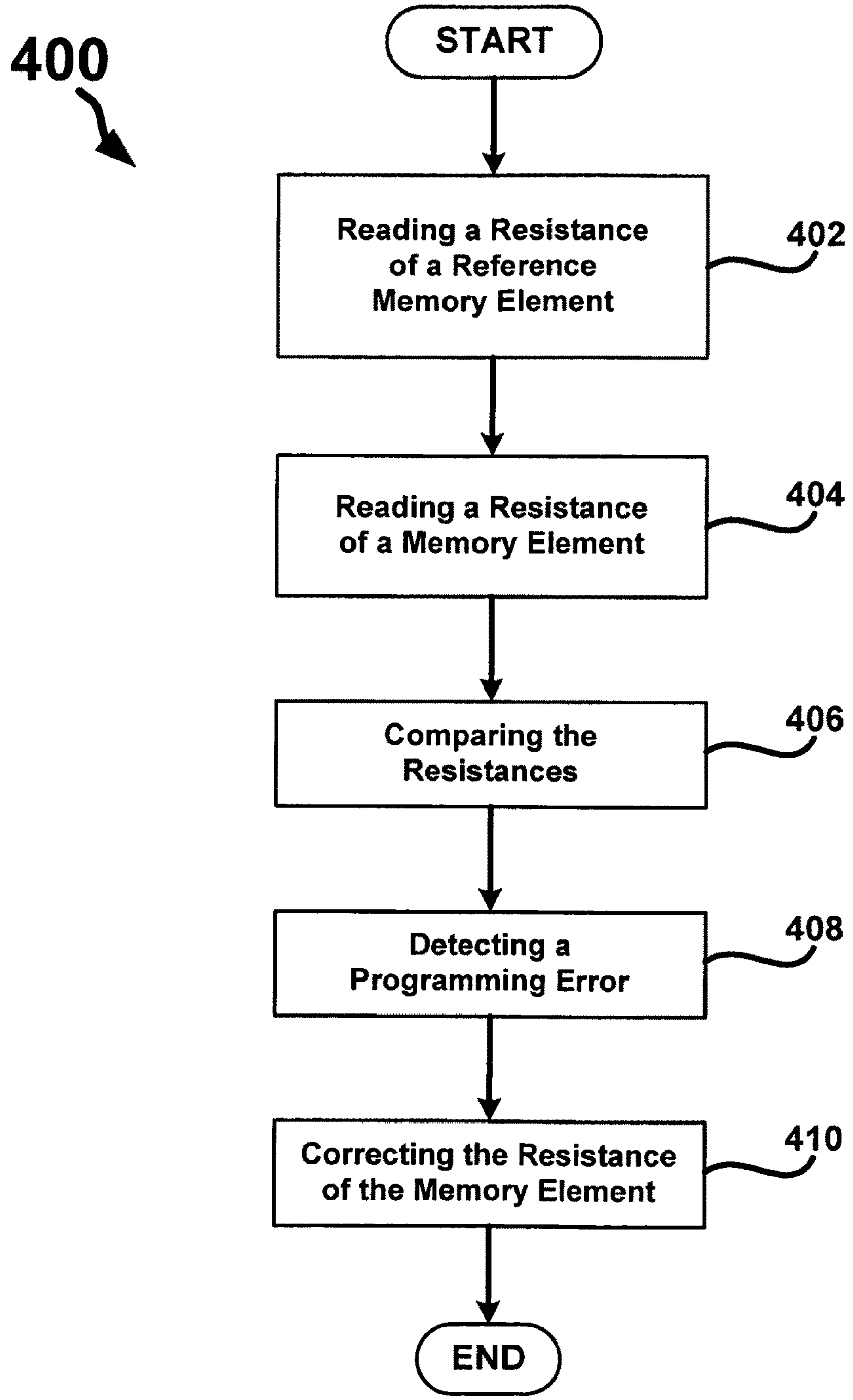
FIG. 4A depicts a flowchart of one example of operations for memory scrubbing.

FIG. 4A depicts a flowchart diagram 400 of one example of operations for memory scrubbing, in accordance with an embodiment. As shown in FIG. 4A, a reference resistance of a reference memory element is read at a stage 402. The reference memory element is programmed to represent a standard of comparison in which the other memory elements can be compared to or tested against. A memory system can include one reference memory element or a plurality of reference memory elements for each resistive state, such as two reference memory elements programmed to define the boundaries of a resistive state.

At a stage 404, the resistance of a memory element in the memory array is also read. The memory element in the memory array is the selected memory element that stores data being checked for errors. The memory system can generate a random address and read the resistance of a memory element at the random address (e.g., a selected memory element positioned at the intersection of a row and column line in the array indicated by the address). The memory system can also generate the address systematically, such as incrementing an address counter or the like that generates a predictable sequence of addresses, for example. Thereafter, the reference resistance of the reference memory is compared with the resistance of the memory element at a stage 406. In an embodiment, a comparison can be made by sensing a difference between the two resistances. For example, the comparison can be done by sensing the voltage or current difference between the reference memory element and the memory element. By sensing the difference, the resistive state of the memory element can be determined. Sense amp circuitry can be used to sense the difference between the reference memory element and the memory element in the current domain or the voltage domain, for example.

At a stage 408, a programming error can be detected based on the sensed difference. A memory system can detect a programming error when a resistance of a memory element does not fall within or is outside a predefined resistive state. For example, as will be explained in greater detail below, a memory element can be programmed in error when the resistance of the memory element is between two resistive states. If a programming error is detected, the resistance of the memory element is corrected at a stage 410. In an embodiment, the resistance of the memory element can be corrected by reprogramming the memory element (e.g., re-writing the correct resistance value to the memory element). In general, a memory element can be programmed (or reprogrammed) by applying a voltage across the memory element (e.g., a write voltage). Depending on a polarity of the voltage, the resistance of the memory element is either increased or decreased. The memory system can conduct a memory scrubbing operation (checking for and correcting errors) when the memory is idle or unselected. It should be noted that after the memory scrubbing operation, the memory system can further conduct an error-correcting code (ECC) check on data stored in a series of memory elements. The information gained from the ECC check may be further used to read and correct data stored in the buffer of a memory system. After data stored in the buffer has been corrected, the corrected data can be programmed (e.g., re-written) into the series of memory elements by applying the appropriate magnitude and polarity of write voltage across the terminals of the memory elements.

Figure 4B:
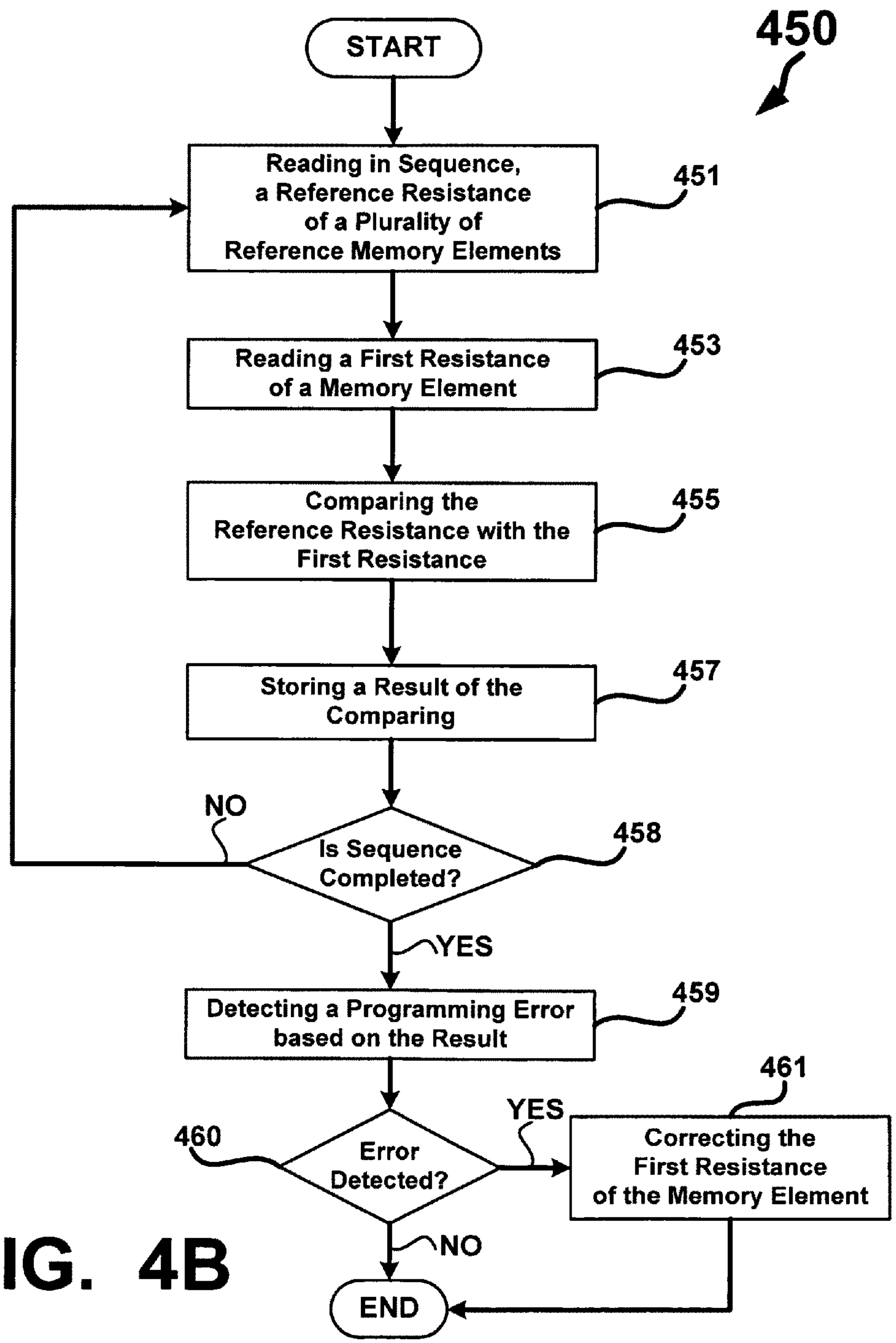
FIG. 4B depicts a flowchart of another example of operations for memory scrubbing.

Reference is now made to FIG. 4B, where flow diagram 450 depicts another example of memory scrubbing using sequential readings of reference resistances of a plurality of reference memory cells as described below in regards to FIGS. 5, 6 and 7. Here, at a stage 451, a reference resistance of a reference resistance element is read. In the flow diagram 450, there are a plurality of reference resistance elements that will have their respective reference resistances read in a sequence. At a stage 453 a first resistance of a memory element (e.g., the selected memory element) is read. At a stage 455 the first resistance is compared with the reference resistance of a first one of the pluralities of reference resistance elements. At a stage 457 a result of the comparison is stored (e.g., in a memory or register). At a stage 458 a determination is made as to whether or not the sequence of reading the reference resistances of the reference resistance elements is completed (e.g., have all the reference resistances of the reference resistance elements been read and compared with the first resistance?). For example, there can be four reference resistance elements with each reference resistance element storing a different value of the reference resistance. The sequence is completed when the reference resistances of all four reference resistance elements have been read and compared with the first resistance. Termination of the sequential reading of the reference memory cells can be set to occur after a predetermined number of readings such as 4 times, 8 times, 16 times, etc. Therefore if there are 8 reference memory elements, the sequence can be set to terminate after only 4 sequential readings. Referring back to the stage 458, if the sequence is not completed, a NO branch is taken from the stage 458 to the stage 451 and the reference resistance of a next one of the plurality of reference resistance elements is read at the stage 451 and is compared with the first resistance at the stage 455, and the result of the comparison is stored at the stage 457 and the NO branch is again taken at the stage 458 if the sequence is not completed and the process repeats at the stage 451 until the sequence is completed and a YES branch is taken from the stage 458. At a stage 459 the stored results from the stage 457 are decoded to determine if there is a programming error in the first resistance of the memory element. The results from the stage 457 can be accumulated into one memory location (e.g., a register or the like) or each separate result can be stored in a separate memory location and then all of the results from the separate memory locations can be combined and decoded at the stage 459. At a stage 460, if an error is detected, a YES branch is taken. At a stage 461 the first resistance of the memory element is corrected (e.g., re-written or re-programmed) and the process can terminate. On the other hand, if no error is detected, then a NO branch is taken, the first resistance need not be corrected, and the process can terminate. The number of iterations of the sequence of reading the reference resistances of the plurality of reference memory elements can be determined by the number of states stored by a memory element. For example, if a memory element stores four resistive states 0-3 represented by binary values 00, 01, 10, and 11, then sequence can repeat until all four states have been examined. Using the preceding example, in some applications the sequence can repeat more times than the number of states, such that the sequence can repeat eight times instead of four. As another example, if a memory element stores two resistive states "0" and "1", then the sequence can repeat at least two times. In the flow diagram of FIG. 4B, when the NO branch from stage 458 is taken, the reading of the first resistance at the stage 453 can be repeated as part of the sequence, or the very first reading of the first resistance at the stage 453 can be stored (e.g., in a memory, register, or capacitor) and then compared with each newly read reference resistance at the stage 455 such that the stage 453 is skipped for subsequent repetitions of the sequence.

Figure 5:
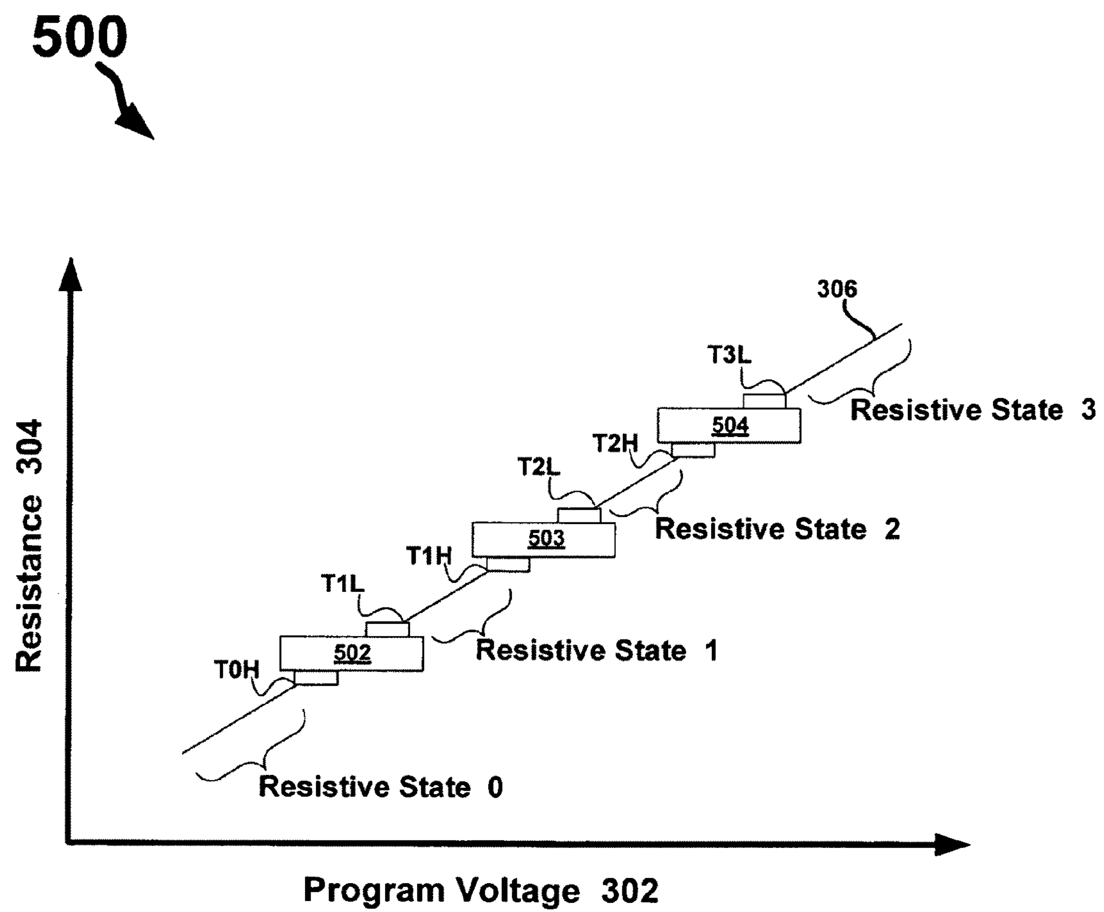
FIG. 5 depicts a graph of multiple resistive states and sensing windows that may associated with a memory element, in accordance with an embodiment.

FIG. 5 depicts a graph 500 of multiple resistive states and sensing windows that can be associated with a memory element, in accordance with an embodiment. FIG. 5 depicts a graph of a memory element divided into four resistive states 0-3. The graph is defined by horizontal axis 302 and vertical axis 304. The program voltages associated with the memory element define the coordinates along horizontal axis 302. The resistances associated with the memory element define the coordinates along vertical axis 304. The plot of the resistances and the program voltages depicts a linear line 306. It should be noted that the resistances may not be linear with program voltages (e.g., a non-linear I-V characteristic for the memory element). Line 306 is divided into four resistive states, namely resistive state 0, resistive state 1, resistive state 2, and resistive state 3. Located between resistive states 0-3 are regions of sensing windows 502-504. Sensing windows 502-504 may be defined at particular resistances. Here, sensing window 502 is located between resistive states 0 and 1. Sensing window 503 is located between resistive states 1 and 2. Sensing window 504 is located between resistive states 2 and 3.

As discussed above, the resistive state of a memory element can be determined by comparing the resistance of the memory element with the resistance of a reference memory element. For example, the resistive state of a memory element can be determined by sensing (e.g., in a voltage domain or a current domain) a difference between the resistance of the memory element and the resistance of a reference memory element. In an embodiment, the difference can be sensed by subtracting the resistance of the memory element from the resistance of the reference memory element. The difference can indicate whether the resistance of the memory element is higher or lower than the resistance of the reference memory element. For example, with dual resistive states (or a memory element with two resistive states), the resistive state of a memory element can be determined by comparing the resistance of a memory element with a single reference memory element. The reference memory element is configured to define a resistive midpoint of the two resistive states. A first resistive state can be defined as a resistance that is higher than the resistance of the reference memory element. A second resistive state can be defined as a resistance that is lower than the resistance of the reference memory element.

With three or more resistive states, a plurality of reference memory elements are used for the comparison. For example, as shown in FIG. 5, a reference memory element may be associated with each resistive boundary T0H, T1L, T1H, T2L, T2H, or T3L. In other words, memory system can include multiple reference memory elements that define the resistive boundaries T0H, T1L, T1H, T2L, T2H, and T3L. The resistance of a memory element is compared with each reference memory element. A resistance of higher than T1L but lower than T1H indicates that the memory element is in resistive state 1. In other words, a resistance that is between T1L and T1H indicates that the memory element is in resistive state 1. In another example, a resistance of lower than T0H indicates that the memory element is in resistive state 0. The following Table 1 depicts the use of the sensed differences to determine the resistive state of a memory element.

TABLE 1

| T0H | T1L | T1H | T2L | T2H | T3L | Output |
|---|---|---|---|---|---|---|
| 0 | 0 | 0 | 0 | 0 | 0 | 00 |
| 1 | 0 | 0 | 0 | 0 | 0 | Error |
| 1 | 1 | 0 | 0 | 0 | 0 | 01 |
| 1 | 1 | 1 | 0 | 0 | 0 | Error |
| 1 | 1 | 1 | 1 | 0 | 0 | 10 |
| 1 | 1 | 1 | 1 | 1 | 0 | Error |
| 1 | 1 | 1 | 1 | 1 | 1 | 11 |

In Table 1, a "0" value indicates that the resistance of the memory element is less than the resistance of the reference memory element. A "1" value indicates that the resistance of the memory element is greater than the resistance of the reference memory element. As shown in Table 1, the "0" and "1" values can be used to generate a two bit decoded output that indicates the resistive state of the memory element. The four resistive states 0-3 may be represented by binary values such as 00, 01, 10, and 11. If the resistance of the memory element falls within sensing window 502, 503, or 504 (or if the resistance of the memory element is outside resistive state 0, 1, 2, or 3), then the output value indicates a programming error. A programming error can indicate that the memory element is in an erroneous resistive state and the memory system can correct the resistance of the memory element to place the memory element into a defined resistive state, such as resistive state 0, 1, 2, or 3. In an embodiment, the correction includes reprogramming the memory element. For example, if most programming errors in a memory array are caused by resistance loss (e.g., a nominal resistance value of a memory element drifts downward over time), then the correction can include programming the memory element to a higher resistance level (i.e., increasing the resistance of the memory element) to place the memory element in a next, higher resistive state, such as resistive state 0, 1, 2, or 3. On the other hand, if most programming errors are caused by resistance gain (e.g., a nominal resistance value of a memory element drifts upward over time), then the correction may include programming the memory element to a lower resistance level (i.e., decreasing the resistance of the memory element) to place the memory element in a next, lower resistive state, such as resistive state 0, 1, 2, or 3.

Figure 6:
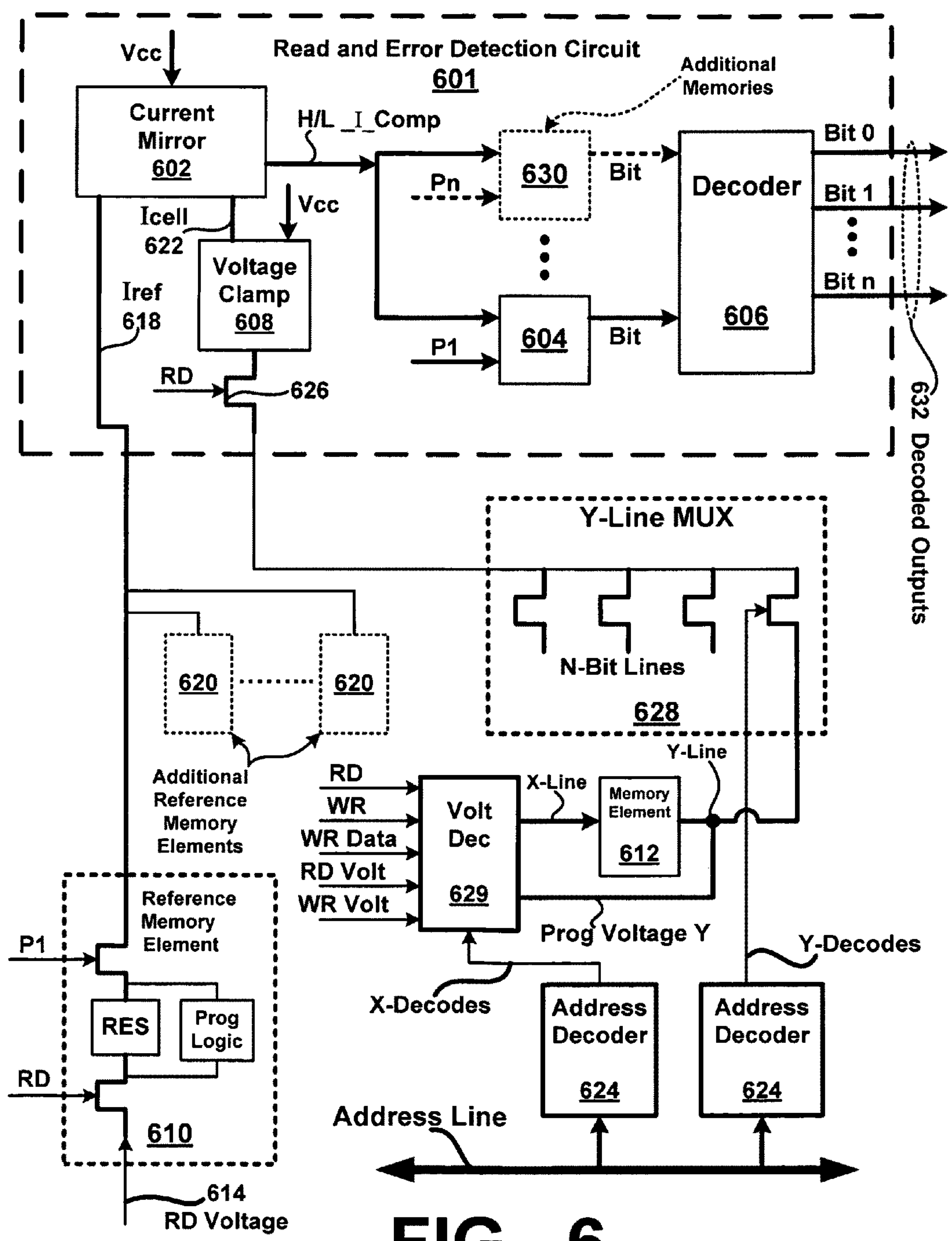
FIG. 6 depicts a schematic diagram of a read and error detection circuit, in accordance with an embodiment.

FIG. 6 depicts a schematic diagram of a read and error detection circuit, in accordance with an embodiment. As shown in FIG. 6, read and error detection circuit 601 can include current mirror 602, memory 604, and decoder 606. Reference memory element 610 and memory element 612 are connected to read and error detection circuit 601. The reference memory element 610, the memory element 612, or both, can be fabricated BEOL in one or more memory planes such as the memory planes depicted in FIG. 2, for example. The active circuitry elements of FIG. 6 can be fabricated FEOL. The current mirror 602 includes two inputs and an output. Reference memory element 610 is connected to an input of current mirror 602 and memory element 612 is connected to the other input. Memory 604 (e.g., a register) is connected to the output of current mirror 602. In an embodiment, if memory element 612 supports multiple resistive states, then read and error detection circuit 601 can additionally include decoder 606 connected to memory 604 and, as explained in more detail below, memories 630.

Reference memory element 610 is programmed to represent a standard of comparison in which the other memory elements, such as memory element 612, may be compared to or tested against. With a read operation, a switch enables read voltage 614 to be applied to reference memory element 610. As a result, reference current 618 is outputted from reference memory element 610. If memory element 612 supports multiple resistive states, memory system can include additional reference memory elements 620. The additional reference memory elements 620 can also be fabricated BEOL in one or more memory planes. With multiple reference memory elements 610 and 620, a transistor gate can be added to isolate reference memory element 610 from the other reference memory elements 620. Isolation is done by Phased 1 (P1) gating for first reference memory element 610, P2 for a second reference memory element, and Pn for the last reference memory element. Each reference current, such as current reference $I_{ref}$ 618, can be applied in a sequence that allows the different current references to be compared individually with the memory element (e.g., the current from the memory element), such as the memory element 612 which is currently being read.

A memory array can comprises a plurality of memory elements (e.g., several tens of thousands), such as memory element 612. In a read operation, a read enable voltage is applied to memory element 612. A read enable and an X address decode enable can trigger the application of the read enable voltage. With the application of the read enable voltage, memory element current $I_{cell}$ 622 is outputted from memory element 612. It should be noted that the read enable voltage results in a current $I_{cell}$ on the Y line of memory element 612. The Y line is passed through Y line multiplexer 628 that selects which bit is read. Address decoders 624 are configured to gate the address lines. The enabled output of memory element 612 includes the Y line current $I_{cell}$. The Y line current $I_{cell}$ is isolated by switch 626 that is enabled during read operations. Switch 626 is connected to voltage clamp 608 that keeps the Y line biased at the midpoint between the "1" and "0" voltages, which allows the voltages to switch faster as half the voltage is being switched to the end state.

Reference current $I_{ref}$ 618 and memory element current $I_{cell}$ 622 that are associated with the resistances of reference memory element 610 and memory element 612, respectively, are inputted into or provided to current mirror 602. Current mirror 602 is configured to sense a current difference between reference current $I_{ref}$ 618 and memory element current $I_{cell}$ 622. In some applications the current mirror 602 can amplify one or both of the current signals to effectuate the sensing of the difference between the current signals $I_{ref}$ 618 and $I_{cell}$ 622. Depending on the relationship between reference current $I_{ref}$ 618 and memory element current $I_{cell}$ 622, current mirror 602 outputs a high current or a low current denoted as H/L_I_Comp. For example, memory element current $I_{cell}$ 622 that is higher than reference current $I_{ref}$ 618 can drive the current output H/L_I_Comp to a high. However, if memory element current $I_{cell}$ 622 is lower than reference current $I_{ref}$ 618, then current mirror 602 can drive the current output H/L_I_Comp to a low. Conversely, memory element current $I_{cell}$ 622 that is higher than reference current $I_{ref}$ 618 can drive the current output H/L_I_Comp to a low while the memory element current $I_{cell}$ that is lower than the reference current $I_{ref}$ can drive the current output H/L_I_Comp to a high.

The current output from current mirror 602 is sampled by memory 604 (e.g., a register, a latch, or other memories) to be stored. With multiple resistive states, read and error detection circuitry 601 can include additional memories 630. With multiple memories 630, each reference memory element, such as reference memory elements 610 and 620, is sequentially compared to the memory element, such as memory element 612, being read. The resultant current difference or comparison H/L_I_Comp outputted from current mirror 602 is stored in a memory, such as memories 604 and 630. The additional memories 604, 630, . . . can be BEOL memory as described above.

With dual resistive states, the value stored in memory 604 may be directly gated out of read and error detection circuit 601. With three or more resistive states, the values stored in memories 604 and 630 are applied to decoder 606. Decoder 606 translates the settings of memories 604 and 630 to decoded outputs 632. Examples of decoded outputs 632 include binary values such as 00, 01, 10, and 11 that represent the four resistive states.

The following Table 2 depicts the state of decoder 606 for multiple resistive states.

TABLE 2

| | | | | |
|---|---|---|---|---|
| R0 | 0 | 1 | 1 | 1 |
| R1 | 0 | 0 | 1 | 1 |
| R2 | 0 | 0 | 0 | 1 |
| Output | 00 | 01 | 10 | 11 |

In Table 2, R0-R2 are the non-erroneous values stored in registers 604 and 630 inputted into decoder 606 while Table 1 depicts the values possible to be inputted into the decoder. Decoder 606 can be used to detect and/or correct programming errors. For example, resistive state of 10 (T1H=1, T2L=0) can represent an erroneous state because the upper state (T1H) is set and the lower state (T2L) is not set. It should be appreciated that the erroneous state may be handled in three ways. The output can be passed through unaltered and an error bit can be set that would notify the memory system (or memory controller) that a programming error has occurred. The memory system may then determine the error condition based on ECC or CRC and correct the programming error through a system write operation. Alternatively, decoder 606 could detect the programming error and thereafter, correct the programming error. For example, decoder 606 may be configured to set the decode state. To correct the programming error (or the resistance of memory element 612), decoder 606 may be configured to alter the decode state based on a pre-selected bias to provide a correct output. A pre-selected bias may include an upward or downward bias change. The change in the output decoder function can be a hardcoded function or a programmed function operative to set decode changes, which can be set during manufacture by storing select values. The altered data can result in a potential read error. The design would have the option of sending an error status on the occurrence of a bit bias correction. This error flag can be programmed as an option to be sent or not sent by a non-volatile memory bit. In addition to sending the corrected data as described above, a write operation can be initiated to place the memory element in the desired state based on the corrected data. In other words, the memory element may be reprogrammed (e.g., re-written) based on the corrected decode state. The programming sequence can be made as an option set by a non-volatile bit.

Figure 7:
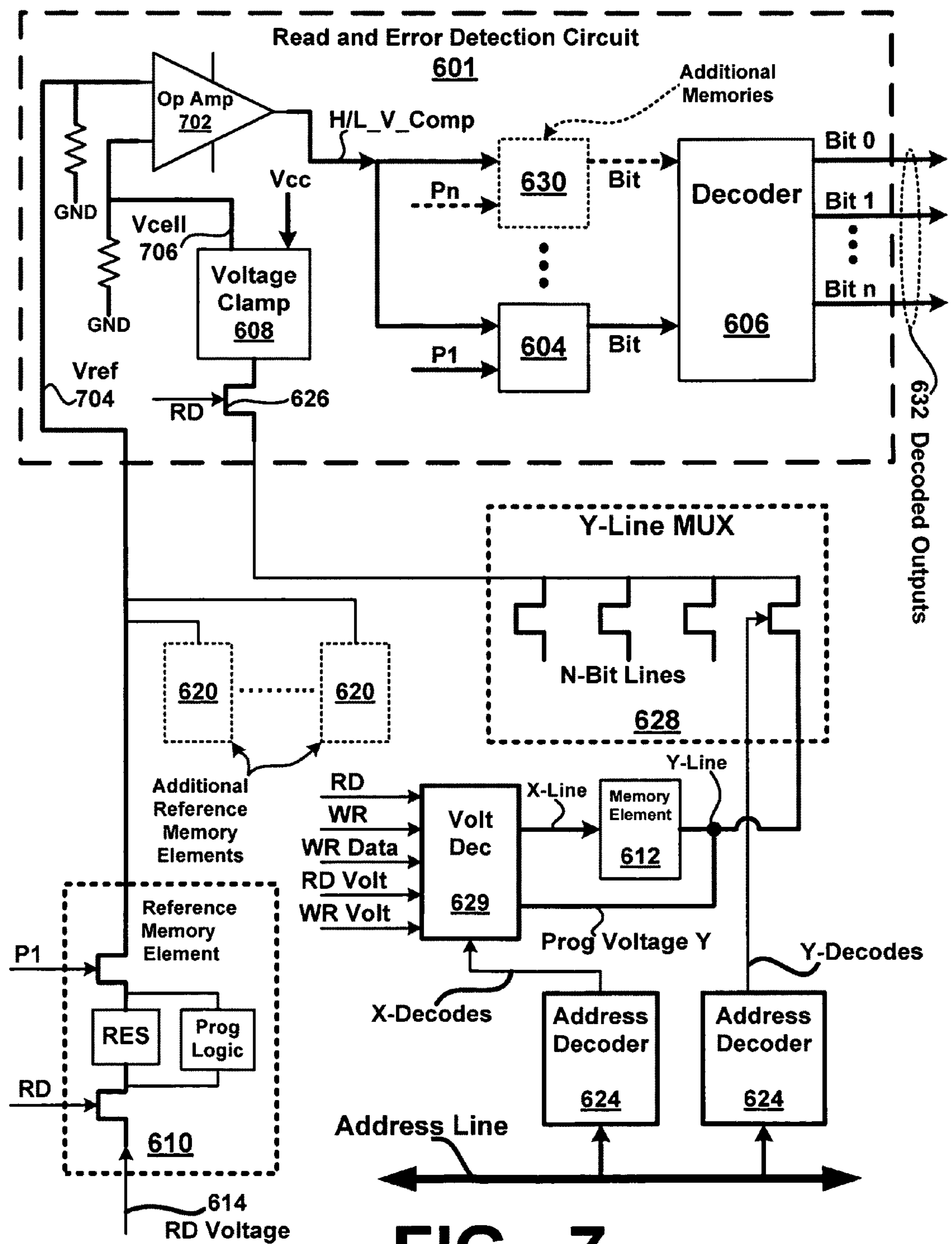
FIG. 7 depicts a schematic diagram of a read and error detection circuit, in accordance with another embodiment.

FIG. 7 depicts a schematic diagram of a read and error detection circuit, in accordance with another embodiment. As shown in FIG. 7, read and error detection circuit 601 can include operational amplifier 702, memory 604, and decoder 606. Reference memory element 610 and memory element 612 are connected to read and error detection circuit 601. Operational amplifier 702 includes two inputs and an output. Reference memory element 610 is connected to an input of operational amplifier 702 and memory element 612 is connected to the other input. Memory 604 (e.g., a register) is connected to the output of operational amplifier 702. In an embodiment, if memory element 612 supports multiple resistive states, then read and error detection circuit 601 can additionally include decoder 606 connected to memories 604 and 630.

With a read operation, a switch enables read voltage 614 to be applied to reference memory element 610. As a result, a reference voltage $V_{ref}$ 704 that is associated with the resistance of reference memory element 610 is outputted from the reference memory element 610. If memory element 612 supports multiple resistive states, memory system may include additional reference memory elements 620. With multiple reference memory elements 610 and 620, a transistor gate can be added to isolate reference memory element 610 from the other reference memory elements 620. Isolation is done by P1 gating for first reference memory element 610, P2 for a second reference memory element, and Pn for the last reference memory element. Each reference voltage reference, such as reference voltage $V_{ref}$ 704, can be applied in sequence and therefore, allows the different reference voltages to be compared individually with the memory element, such as the memory element 612, currently being read.

A memory array comprises multiple memory elements, such as memory element 612. In a read operation, a read enable voltage is applied to memory element 612. A read enable and an X address decode enable can trigger the application of the read enable voltage. With the application of the read enable voltage, memory element voltage 706 associated with the resistance of memory element 612 is outputted from the memory element. It should be noted that the read enable voltage results in a current on the Y line of memory element 612. The Y line is passed through Y line multiplexer 628 that selects which bit is read. Address decoders 624 are configured to gate the address line. The enabled output of memory element 612 includes the Y line current. The Y line current is isolated by switch 626 that is enabled at read operations. Switch 626 is connected to voltage clamp 608 that keeps the Y line biased at the midpoint between the "1" and "0" voltages, which allows the voltages to switch faster as half the voltage is being switched to the end state.

Reference voltage $V_{ref}$ 704 and a memory element voltage $V_{cell}$ 706 that are associated with reference memory element 610 and memory element 612, respectively, are inputted into or provided to operational amplifier 702. Operational amplifier 702 is configured to amplify and sense a voltage difference between reference voltage 704 and memory element voltage 706. Depending on the relationship between reference voltage $V_{ref}$ 704 and memory element voltage $V_{cell}$ 706, operational amplifier 702 outputs a high or low voltage denoted as H/L_V_Comp. For example, memory element voltage $V_{cell}$ 706 that is higher than reference voltage $V_{ref}$ 704 can drive the voltage output H/L_V_Comp to a high. On the other hand, memory element voltage $V_{cell}$ 706 that is lower than reference voltage $V_{ref}$ 704 can drive the voltage output H/L_V_Comp to a low. Conversely, memory element voltage $V_{cell}$ 706 that is higher than reference voltage $V_{ref}$ 704 can drive the voltage output H/L_V_Comp to a low, while the memory element voltage $V_{cell}$ that is lower than the reference voltage $V_{ref}$ can drive the voltage output H/L_V_Comp to a high.

The voltage output from operational amplifier 702 is sampled by memory 604 (e.g., a register, a latch, or other memories) to be stored. In other words, the voltage difference outputted from operation amplifier 702 is stored in memory 604. With multiple resistive states, read and error detection circuitry 601 can include additional memories 630. With multiple memories 630, each reference memory element, such as reference memory elements 610 and 620, is sequentially compared to the memory element, such as memory element 612, being read. The resultant difference or comparison outputted from operational amplifier 702 is stored in a memory, such as memories 604 and 630.

With a dual resistive states (e.g., 1 or 0), the value stored in memory 604 may be directly gated out of read and error detection circuit 601. With three or more resistive states, the values stored in memories 604 and 630 are applied to decoder 606. As discussed above, decoder 606 translates the settings of memories 604 and 630 to decoded outputs 632 and can be used to detect programming errors. Reference memory elements 610 and 620 can also be fabricated BEOL along with the memories 604 and 630. The structure and thin film materials that form the reference memory elements 610 and 620 can be identical to or substantially identical to the structure and thin film materials for the memory elements for memories 604 and 630.

Figure 7A:
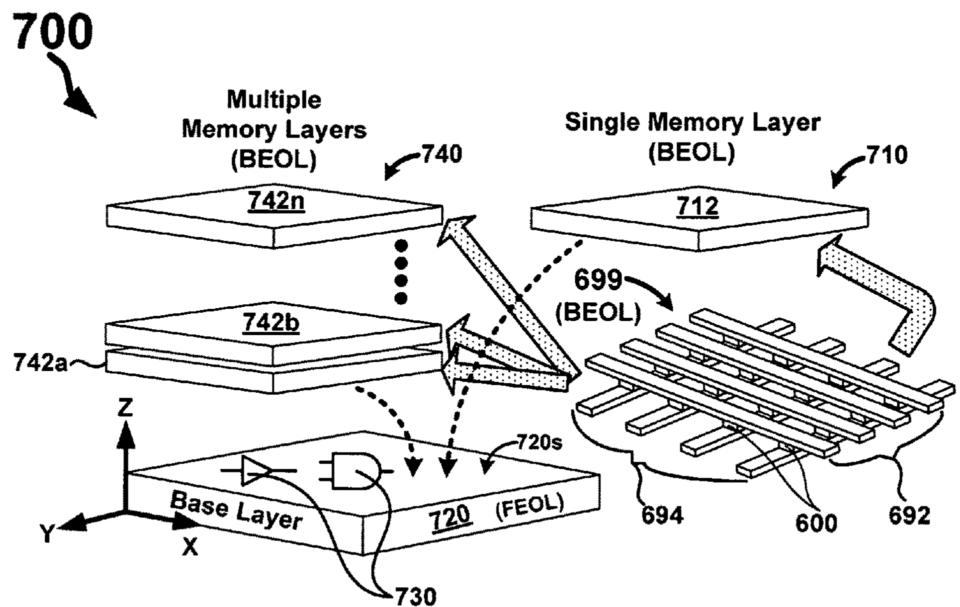
FIG. 7A depicts an integrated circuit including memory cells disposed in a single memory array layer or in multiple memory array layers and fabricated over a substrate that includes active circuitry fabricated in a logic layer.

Turning now to FIG. 7A, an integrated circuit 700 can include non-volatile and re-writable memory cells 600 disposed in a single layer 710 or in multiple layers 740 of memory, according to various embodiments of the invention. The single 710 or multiple 740 layers of memory can be fabricated BEOL. In this example, integrated circuit 700 is shown to include either multiple layers 740 of memory (e.g., layers 742*a*, 742*b*, . . . 742*n*) or a single layer 710 of memory 712 formed directly on top (e.g., fabricated above) of an upper surface 720*s* of a base layer 720 (e.g., a silicon wafer). The base layer 720 can be fabricated FEOL with the single or multiple layers of memory 710 and/or 740 fabricate BEOL on top of the base layer 720. In at least some embodiments, each layer of memory (712, or 742*a*, 742*b*, . . . 742*n*) can include the cross point array 699 fabricated (e.g., BEOL) and having conductive array lines (692, 694) arranged in different directions (e.g., substantially orthogonal to one another) to access memory cells 600 (e.g., two-terminal memory cells). For example, conductors 692 can be X-direction array lines (e.g., row conductors) and conductors 694 can be Y-direction array lines (e.g., column conductors). Base layer 720 (e.g., substrate 602 in FIG. 6) can include a bulk semiconductor substrate upon which circuitry, such as memory access circuits (e.g., address decoders, drivers, sense amps, etc.) can be formed. For example, base layer 720 may be a silicon (Si) substrate upon which the active circuitry 732 and 734 are fabricated. The active circuitry 732 and 734 can include analog and digital circuits configured to perform data operations on the memory layer(s) that are fabricated above the base layer 720. An interconnect structure (not shown) including vias, plugs, thrus, and the like, may be used to electrically communicate signals from the active circuitry 730 to the conductive array lines (692, 694).

Figure 8A:
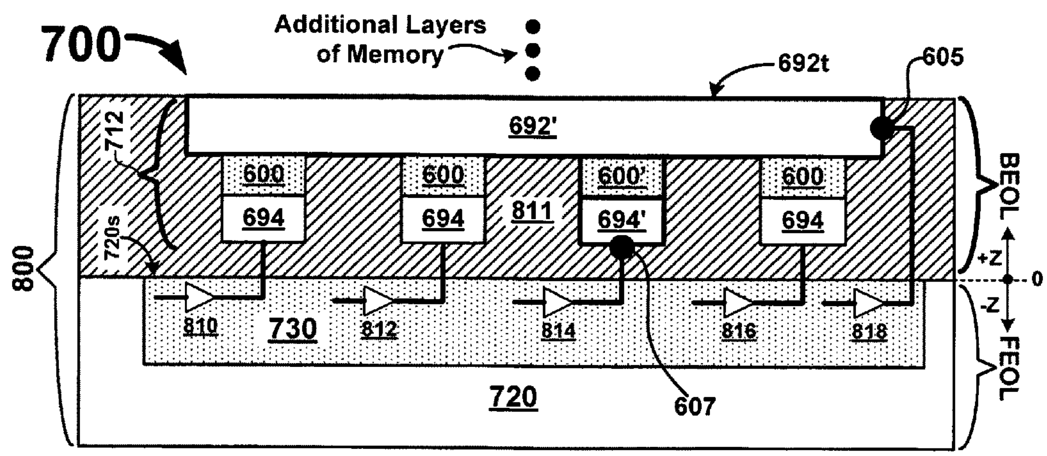
FIG. 8A depicts a cross-sectional view of an integrated circuit including a single layer of memory fabricated over a substrate including active circuitry fabricated in a logic layer.

Reference is now made to FIG. 8A, where integrated circuit 700 includes the base layer 720 and active circuitry 732 and 734 fabricated on the base layer 720. As one example, the base layer 720 can be a silicon (Si) wafer and the active circuitry 732 and 734 can be microelectronic devices formed on the base layer 720 using a CMOS fabrication process. The memory cells 600 and their respective conductive array lines (692, 694) can be fabricated on top of upper surface 720*s* and above the active circuitry 732 and 734 in the base layer 720. Those skilled in the art will appreciate that an inter-level interconnect structure (not shown) can electrically couple the conductive array lines (692, 694) with the active circuitry 732 and 734 which may include several metal layers. For example, vias can be used to electrically couple the conductive array lines (692, 694) with the active circuitry 732 and 734. The active circuitry 732 and 734 may include but is not limited to address decoders, sense amps, memory controllers, data buffers, direct memory access (DMA) circuits, voltage sources for generating the read and write voltages, just to name a few. For example, active circuits 810-818 can be configured to apply the select voltage potentials (e.g., read and write voltage potentials) to selected conductive array lines (692', 694') for selected memory cell 600' via terminals 804 and 806 that are electrically coupled with outputs of active circuits 814 and 818 respectively. Moreover, active circuits 810-818 may be coupled with the conductive array lines (692', 694') to sense the read current $I_R$ from selected memory cells 600' during a read operation and the sensed current can be processed by active circuits 810-818 to determine the conductivity profiles (e.g., the resistive state) of the selected memory cells 600'. In some applications, it may be desirable to prevent un-selected array lines (692, 694) from floating. The active circuits 810-818 can be configured to apply an un-select voltage potential (e.g., approximately a ground potential) to the un-selected array lines (692, 694). A dielectric material 811 (e.g., $SiO_2$) may be used where necessary to provide electrical insulation between elements of the integrated circuit 700.

Figure 8B:
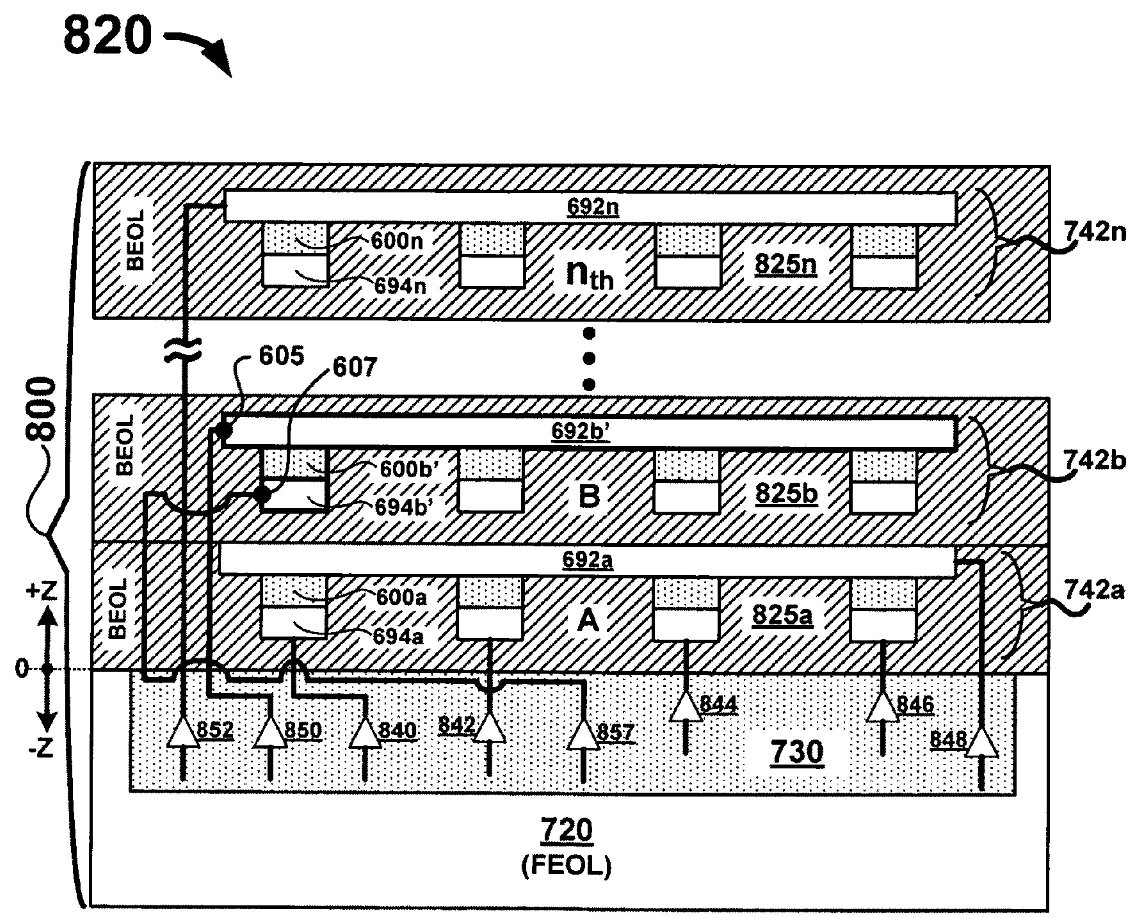
FIG. 8B depicts a cross-sectional view of an integrated circuit including vertically stacked layers of memory fabricated over a substrate including active circuitry fabricated in a logic layer.
Figure 9:
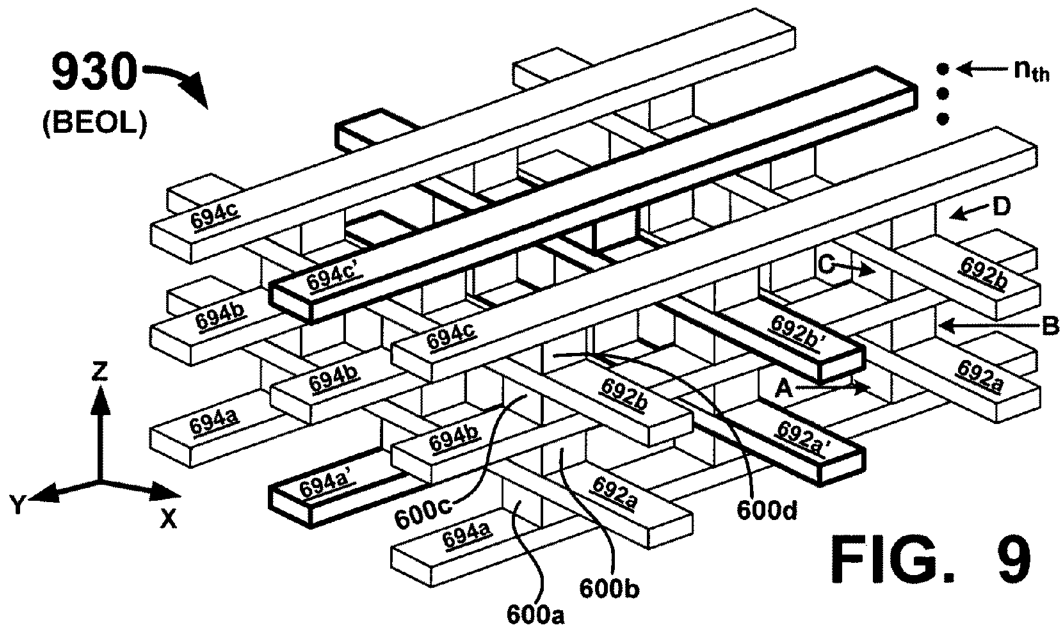
FIG. 9 depicts a vertically stacked layers of memory in which conductive array lines are shared by memory cells in adjacent layers.
Figure 10:
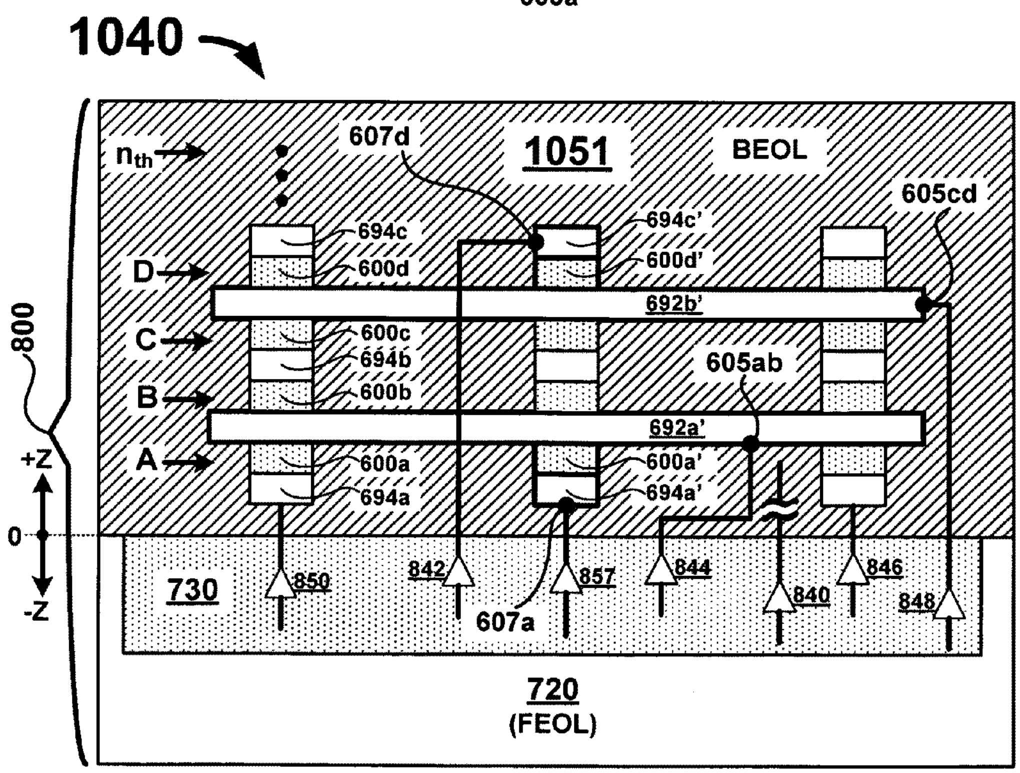
FIG. 10 depicts an integrated circuit including vertically stacked layers of memory with shared conductive array lines fabricated over a substrate including active circuitry fabricated in a logic layer.

Therefore, some or all of the circuitry depicted in FIGS. 1, 2, 6, and 7 can be fabricated FEOL in the base layer 720 and the one or more layers of memory depicted in those FIGS. can be fabricated BEOL above the base layer 720 as depicted in FIG. 7A. The one or more layers of memory can include memory elements for data storage, and can also include the aforementioned reference memory elements. The memory elements and the reference memory elements can be disposed on the same memory plane or on different memory planes. Although only a single layer of memory 712 is depicted in FIG. 8A, additional layers of memory (e.g., 742*a*-742*n*) can be vertically fabricated BEOL above an upper surface 692*t* of conductive array line 692 to form a multi-layer cross-point memory array. The vertically stacked layers of memory can have electrically isolated conductive array lines as depicted in FIG. 8B, or can have shared conductive array lines as depicted in FIGS. 9 and 10. Whether a single layer 712 or multiple layers 742*a*-742*n*, the connected combination of the base layer 720 and the memory layer(s) comprises a die 800 that can be one of a plurality of die 800 on a substrate such as a silicon wafer or a die 800 that has been sigulated (e.g., cut) from the substrate as will be described in greater detail below in regards to FIG. 11.

Turning now to FIG. 8B, an integrated circuit 820 includes a plurality of non-volatile memory arrays 742*a*, 742*b*, . . . 742*n* that are vertically stacked above one another (e.g., along the +Z axis) and are positioned above the base layer 720 that includes the active circuitry 730. Collectively, the FEOL base layer 720 and the plurality of non-volatile BEOL memory arrays 742*a*, 742*b*, . . . 742*n* can be referred to as a die 800. The integrated circuit 820 includes vertically stacked memory layers A and B and may include additional memory layers up to an nth memory layer. The memory layers A, B, . . . through the nth layer can be electrically coupled with the active circuitry 730 in the base layer 720 by an inter-level interconnect structure as was described above. Layer A includes memory cells 600*a* and first and second conductive array lines (692*a*, 694*a*), Layer B includes memory cells 600*b* and first and second conductive array lines (692*b*, 694*b*), and if the nth layer is implemented, then the nth layer includes memory cells 600*n* and first and second conductive array lines (692*n*, 694*n*). Dielectric materials 825*a*, 825*b*, and 825*n* (e.g., $SiO_2$) may be used where necessary to provide electrical insulation between the memory layers and memory elements of the integrated circuit 820. Active circuits 840-857 can be configured to apply the select voltage potentials (e.g., read and write voltage potentials) to selected conductive array lines (e.g., 692*a, b*, . . . n, and 694*a, b*, . . . n). Driver circuits 850 and 857 are activated to select conductive array lines 692' and 694' to select memory cell 600*b'* for a data operation. As was described above, the active circuits 730 can be used to sense the read current $I_R$ from selected memory cells 600*b'* during a read operation and can be configured to apply the un-select voltage potential to the un-selected array lines.

Attention is now directed to FIG. 9, where a vertically stacked array 930 includes a plurality of memory layers A,B, C, and D with each memory layer including memory cells 600*a*, 600*b*, 600*c*, and 600*d*. Although only four layers are depicted, the array 930 can include additional layers up to an nth layer. The array 930 includes two levels of x-direction conductive array lines 692*a* and 692*b*, and three levels of y-direction conductive array lines 694*a*, 694*b*, and 694*c*. In contrast to the integrated circuit 820 depicted in FIG. 8B where each array layer is electrically isolated from other layers by a dielectric material (825*a*, 825*b*, . . . 825*n*), each memory cell 600*a*, 600*b*, 600*c*, and 600*d* shares a conductive array line with other memory cells that are positioned above, below, or both above and below that memory cell. Conductive array lines 692*a'* and 694*a'* select a memory cell 600*a'* for a data operation, and conductive array lines 692*b'* and 694*c'* select a memory cell 600*d'* for a data operation (see FIG. 10).

In FIG. 10, an integrated circuit 1040 includes base layer 720, active circuitry 730, and vertically staked memory layers A, B, C, and D that are fabricated above the base layer 720. Collectively, the FEOL base layer 720 and the plurality of non-volatile BEOL memory layers A, B, C, and D can be referred to as a die 800. Active circuits 840-857 are configured to perform data operations on the vertically staked memory layers A, B, C, and D. Driver circuits 844 and 857 are activated to select memory cell 600*a'* for a data operation and driver circuits 842 and 848 are activated to select memory cell 600*d'* for a data operation. A dielectric layer 1051 is operative to electrically isolate the various components of integrated circuit 1040.

Figure 11:
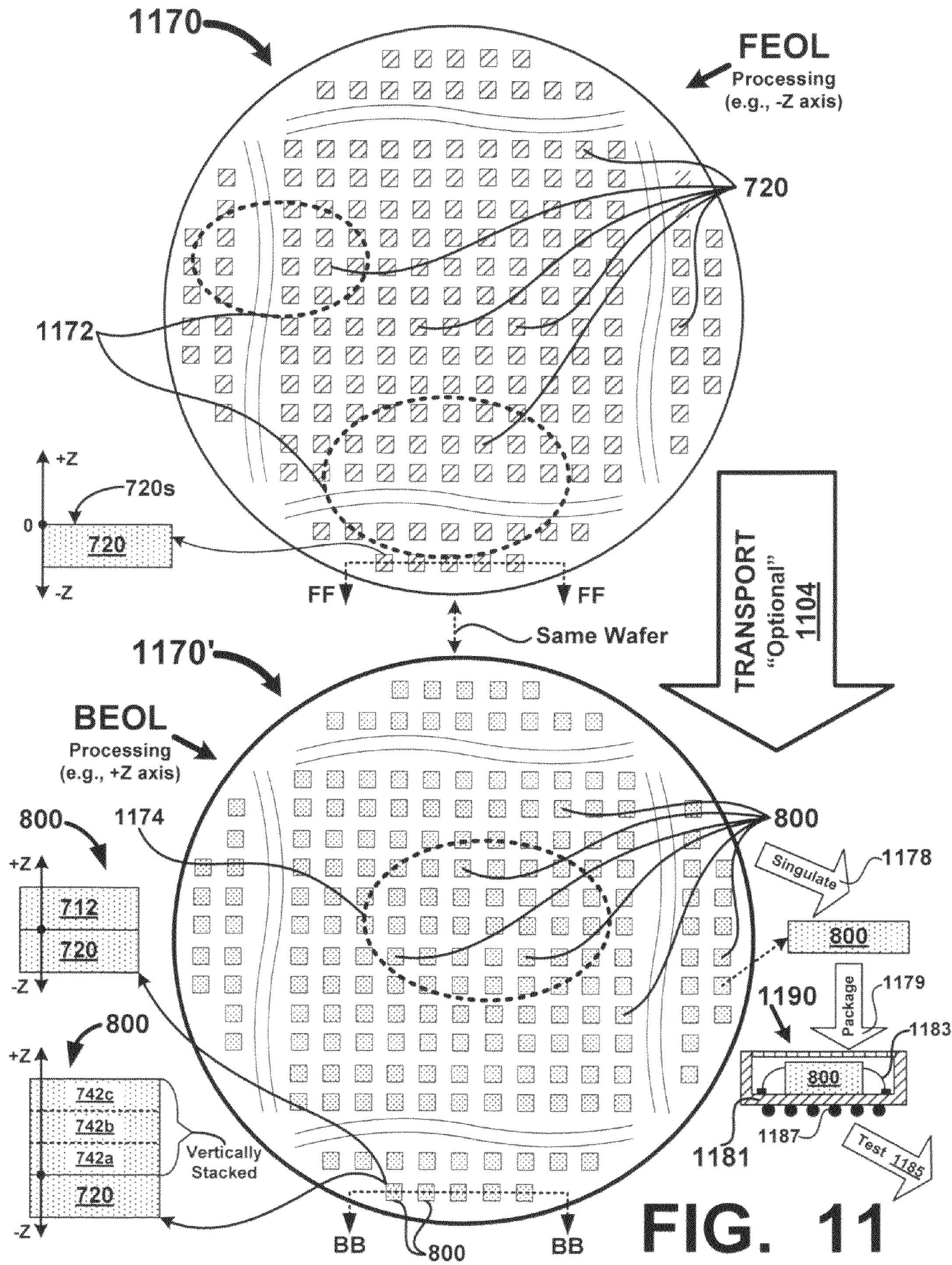
FIG. 11 depicts top plan views of a wafer processed FEOL to form a plurality of base layer die including active circuitry and the same wafer subsequently processed BEOL to form one or more layers of memory directly on top of the base layer die where the finished die can subsequently be singulated, tested, and packaged into integrated circuits.

Reference is now made to FIG. 11, where a top plan view depicts a single wafer (denoted as 1170 and 1170') at two different stages of fabrication: FEOL processing on the wafer denoted as 1170 during the FEOL stage of processing where active circuitry 730 is formed; followed by BEOL processing on the same wafer denoted as 1170' during the BEOL stage of processing where one or more layers of non-volatile memory are formed. Wafer 1170 includes a plurality of the base layer die 720 (see 720 in FIG. 7) formed individually on wafer 1170 as part of the FEOL process. As part of the FEOL processing, the base layer die 720 may be tested 1172 to determine their electrical characteristics, functionality, performance grading, etc. After all FEOL processes have been completed, the wafer 1170 is optionally transported 1104 for subsequent BEOL processing (e.g., adding one or more layers of memory such as single layer 712 or multiple layers 742*a*, 742*b*, . . . 742*n*) directly on top of each base layer die 720. A base layer die 720 is depicted in cross-sectional view along a dashed line FF-FF where the substrate the die 720 is fabricated on (e.g., a silicon Si wafer) and its associated active circuitry 730 are positioned along the −Z axis. For example, the one or more layers of memory are grown directly on top of an upper surface 720*s* of each base layer die 720 as part of the subsequent BEOL processing.

During BEOL processing the wafer 1170 is denoted as wafer 1170', which is the same wafer subjected to additional processing to fabricate the memory layer(s) directly on top of the base layer die 720. Base layer die 720 that failed testing may be identified either visually (e.g., by marking) or electronically (e.g., in a file, database, email, etc.) and communicated to the BEOL fabricator and/or fabrication facility. Similarly, performance graded base layer die 720 (e.g., graded as to frequency of operation) may identified and communicated to BEOL the fabricator and/or fabrication facility. In some applications the FEOL and BEOL processing can be done by the same fabricator or performed at the same fabrication facility. Accordingly, the transport 1104 may not be necessary and the wafer 1170 can continue to be processed as the wafer 1170'. The BEOL process forms the aforementioned memory layer(s) directly on top of the base layer die 720 to form a finished die 800 (see die 800 in FIGS. 8A, 8B, and 10) that includes the FEOL circuitry portion 720 along the −Z axis and the BEOL memory portion along the +Z axis (see FIGS. 8A-10). A cross-sectional view along a dashed line BB-BB depicts a memory device die 800 with a single layer of memory 712 grown (e.g., fabricated) directly on top of base die 720 along the +Z axis, and alternatively, another memory device die 800 with three vertically stacked layers of memory 742*a*, 742*b*, and 742*c* grown (e.g., fabricated) directly on top of base die 720 along the +Z. Finished die 800 on wafer 1170' may be tested 1174 and good and/or bad die identified. Subsequently, the wafer 1170' can be singulated 1178 to remove die 800 (e.g., die 800 are precision cut or sawed from wafer 1170') to form individual memory device die 800. The singulated die 800 may subsequently be packaged 1179 to form integrated circuits 1190 for mounting to a PC board or the like, as a component in an electrical system (not shown). Here a package 1181 can include an interconnect structure 1187 (e.g., pins, solder balls, or solder bumps) and the die 800 mounted in the package 1181 and electrically coupled 1183 with the interconnect structure 1187 (e.g., using wire bonding). The integrated circuits 1190 (IC 1190 hereinafter) may undergo additional testing 1185 to ensure functionality and yield.

One or more of the IC's 1190 can be used in systems requiring memory scrubbing as a technique for preventing and/or correcting errors in stored data including but not limited to data storage systems, a system requiring non-volatile memory, a system requiring emulation of one or more memory types as described above. Unlike conventional FLASH non-volatile memory, the IC's 1190 do not require an erase operation prior to a write operation so the latency associated with the erase operation is eliminated and the latency associated with FLASH OS and/or FLASH file system required for managing the erase operation and/or other FLASH operations are eliminated.

The above-described embodiments provide methods, systems, and circuitries for memory scrubbing in third dimension memories. By sensing the resistance difference between memory elements and reference memory elements, programming errors may be detected. Upon the detection of the programming errors, the programming errors can be corrected by, for example, reprogramming the memory element. As a result of the memory scrubbing operation, the overall reliability of the third dimension memory can be improved.

The foregoing examples have been described in some detail for purposes of clarity of understanding, but are not limited to the details provided. There are many alternative ways and techniques for implementation. The disclosed examples of the various embodiments of the invention are illustrative and not restrictive.

What is claimed is:

1. A memory system, comprising:

a plurality of reference memory elements, each reference memory element having a distinct reference resistance value;

a back-end-of-the-line (BEOL) memory element configured to store multiple bits of data; and a front-end-of-the-line (FEOL) read and error detection circuit in electrical communication with the plurality of reference memory elements and the BEOL memory element, the FEOL read and error detection circuit configured to sequentially sense a difference between the distinct reference resistance of each of the plurality of reference memory elements and a first resistance of the BEOL memory element, wherein, based on the differences, the FEOL read and error detection circuit is further configured to output a decode state indicative of multiple bit data stored in the BEOL memory element or a programming error in multiple bit data stored in the BEOL memory element, and wherein the FEOL read and error detection circuit is further configured to correct the programming error using a pre-selected bias to re-program multiple bit data to the BEOL memory element wherein the FEOL read and error detection circuit is further configured to correct the programming error using a pre-selected bias to re-program multiple bit data to the BEOL memory element, the pre-selected bias comprises an upward or downward bias applied to the BEOL memory element and operative to re-write a corrected decode state indicative of multiple bit data to the BEOL memory element.

2. The memory system of claim 1, wherein the FEOL read and error detection circuit further comprises an operational amplifier including a first input, a second input, and an output, the first input electrically coupled with one of the plurality of reference memory elements and the second input electrically coupled with the BEOL memory element.

3. The memory system of claim 2, wherein the FEOL read and error detection circuit further comprises a BEOL memory electrically coupled with the output.

4. The memory system of claim 3, wherein the FEOL read and error detection circuit further comprises a decoder electrically coupled with the BEOL memory.

5. The memory system of claim 1, wherein the FEOL read and error detection circuit further comprises a current mirror including a first input, a second input, and an output, the first input electrically coupled with one of the plurality of reference memory elements and the second input electrically coupled with the BEOL memory element.

6. The memory system of claim 5, wherein the FEOL read and error detection circuit further comprises a BEOL memory electrically coupled with the output.

7. The memory system of claim 6, wherein the FEOL read and error detection circuit comprises a decoder electrically coupled with the BEOL memory.

8. The memory system of claim 1, wherein the BEOL memory element is positioned in one of a plurality of vertically configured memory planes.

9. The memory system of claim 1, wherein the plurality of reference memory elements comprise BEOL reference memory elements.

10. A read and error detection circuit for scrubbing memory, comprising:

a front-end-of-the-line (FEOL) operational amplifier that includes a first input, a second input, and an output;

a plurality of reference memory elements, each reference memory element having a distinct reference resistance value, the plurality of reference memory elements sequentially electrically coupled with the first input;

a back-end-of-the-line (BEOL) memory electrically coupled with the output of the operational amplifier;

a BEOL memory element included in the BEOL memory and configured to store multiple bit data, the BEOL memory element electrically coupled with the second input; and a decoder electrically coupled with the output of the operational amplifier, wherein the operational amplifier is configured to generate a signal on the output indicative of a difference between the distinct reference resistance values of the reference memory element that is electrically coupled with the first input and a resistance of the BEOL memory element, and wherein the decoder is configured to output a decode state based on the differences, the decode state indicative of multiple bit data stored in the BEOL memory element or indicative of a programming error in multiple bit data stored in the BEOL memory element, and the decoder configured to correct the programming error using a pre-selected bias to re-program multiple bit data to the BEOL memory element, the pre-selected bias comprises an upward or downward bias applied to the BEOL memory element and operative to re-write a corrected decode state indicative of multiple bit data to the BEOL memory element.

11. The read and error detection circuit of claim 10, wherein the operational amplifier is configured to sense a voltage difference between a first voltage associated with a first resistance of the reference memory element that is sequentially electrically coupled with the first input and a second voltage associated with a second resistance of the BEOL memory element.

12. The read and error detection circuit of claim 11, wherein the decoder is configured to detect the programming error based on the voltage difference.

13. The read and error detection circuit of claim 11, wherein the voltage difference is stored in the BEOL memory.

14. The read and error detection circuit of claim 10, wherein the plurality of reference memory elements comprise BEOL reference memory elements.

* * * * *